(12) United States Patent
Mokari et al.

(10) Patent No.: US 7,906,084 B2
(45) Date of Patent: Mar. 15, 2011

(54) METHOD FOR CONTROL OF SHAPE AND SIZE OF PB-CHALCOGENIDE NANOPARTICLES

(75) Inventors: Taleb Mokari, Berkeley, CA (US); Minjuan Zhang, Ann Arbor, MI (US); Peidong Yang, El Cerrito, CA (US)

(73) Assignees: Toyota Motor Engineering & Manufacturing North America, Inc., Erlanger, KY (US); University of California, Berkeley, Berkeley, CA (US)

( * ) Notice: Subject to any disclaimer, the term of this patent is extended or adjusted under 35 U.S.C. 154(b) by 852 days.

(21) Appl. No.: 11/755,522

(22) Filed: May 30, 2007

(65) Prior Publication Data

US 2008/0295762 A1    Dec. 4, 2008

(51) Int. Cl.
    *C01G 21/00*      (2006.01)
(52) U.S. Cl. ....... 423/92; 423/508; 423/509; 423/561.1; 423/619; 977/773; 977/811
(58) Field of Classification Search ............ 423/92, 423/508, 509, 561.1, 619; 977/773, 811
See application file for complete search history.

(56) References Cited

U.S. PATENT DOCUMENTS

| | | | |
|---|---|---|---|
| 5,879,715 A * | 3/1999 | Higgins et al. | 424/489 |
| 7,147,712 B2 | 12/2006 | Zehnder et al. | |
| 7,208,133 B2 | 4/2007 | Cho et al. | |
| 7,255,846 B2 * | 8/2007 | Ren et al. | 423/508 |
| 7,267,810 B2 * | 9/2007 | Yu et al. | 423/508 |
| 7,393,516 B2 * | 7/2008 | Seo et al. | 423/508 |
| 7,586,033 B2 * | 9/2009 | Ren et al. | 136/239 |
| 2005/0036938 A1 * | 2/2005 | Hyeon | 423/561.1 |
| 2006/0110313 A1 * | 5/2006 | Cho et al. | 423/561.1 |

* cited by examiner

*Primary Examiner* — Steven Bos
(74) *Attorney, Agent, or Firm* — Gifford, Krass, Sprinkle, Anderson & Citkowski, P.C.

(57) ABSTRACT

Disclosed is a method for producing, controlling the shape and size of, Pb-chalcogenide nanoparticles. The method includes preparing a lead (Pb) precursor containing Pb and a carboxylic acid dissolved in a hydrocarbon solution and preparing a chalcogen element precursor containing a chalcogen element dissolved in a hydrocarbon solution. The amount of Pb and chalcogen in the respective precursor affords for a predetermined Pb:chalcogen element ratio to be present when the Pb precursor is mixed with the chalcogen element precursor. The Pb precursor is mixed with the chalcogen element precursor to form a Pb-chalcogen mixture in such a manner that Pb-chalcogenide nanoparticle nucleation does not occur. A nucleation and growth solution containing a surfactant is also prepared by heating the solution to a nucleation temperature sufficient to nucleate nanoparticles when the Pb-chalcogen element mixture is added. Upon injection of the Pb-chalcogen element mixture into the heated nucleation and growth solution, Pb-chalcogenide nanoparticles nucleate and a Pb-chalcogenide nanoparticle solution is formed, which is thereafter cooled to a growth temperature that is below the nucleation temperature. The Pb-chalcogenide nanoparticle solution at the growth temperature is held at the growth temperature for a predetermined time period such that a desired nanoparticle size is obtained. The Pb:chalcogen element ratio and a surfactant in the nucleation and growth solution can control the shape of the Pb-chalcogenide nanoparticles. The nucleation temperature, the growth temperature, the time at which the Pb-chalcogenide nanoparticle solution is held at the growth temperature and a surfactant can control the size of the Pb-chalcogenide nanoparticles.

20 Claims, 4 Drawing Sheets

METHOD FOR CONTROL OF SHAPE AND SIZE OF PB-CHALCOGENIDE NANOPARTICLES

FIELD OF THE INVENTION

This invention relates generally to Pb-chalcogenide nanoparticles. More specifically, the invention relates to a method for controlling the shape and size of Pb-chalcogenide nanoparticles.

BACKGROUND OF THE INVENTION

The small band gap and large Bohr radius of Pb (Pb)-chalcogenide materials enables unique optical, electrical and chemical properties with respect to potential applications in solar cells, thermoelectric devices, telecommunication equipment, field effect transistors and biological imaging. However, integrating Pb-chalcogenide materials in these devices requires precise control of their properties. A method for controlling the properties of a Pb-chalcogen material is to control the shape and size of nanoparticles of the material.

Pb-chalcogenide nanoparticles are a family of group IV-VI nanoparticles that are of particular interest due to their size tunable optical and emission properties. Several methods for the preparation of Pb-chalcogenide nanoparticles have been studied, but each has significant deficiencies that have limited the development of technologies based on these materials. As such, an improved method for producing, and controlling the shape and size of, Pb-chalcogenide nanoparticles is needed.

SUMMARY OF THE INVENTION

Disclosed is a method for producing, controlling the shape and size of, Pb-chalcogenide nanoparticles. The method includes preparing a lead (Pb)precursor containing Pb and a carboxylic acid dissolved in a hydrocarbon solution and preparing a chalcogen element precursor containing a chalcogen element dissolved in a hydrocarbon solution. The amount of Pb and chalcogen in the respective precursor affords for a predetermined Pb:chalcogen element ratio to be present when the Pb precursor is mixed with the chalcogen element precursor. The Pb precursor is mixed with the chalcogen element precursor to form a Pb-chalcogen mixture in such a manner that Pb-chalcogenide nanoparticle nucleation does not occur. A nucleation and growth solution containing a surfactant is also prepared by heating the solution to a nucleation temperature sufficient to nucleate nanoparticles when the Pb-chalcogen element mixture is added. Upon injection of the Pb-chalcogen element mixture into the heated nucleation and growth solution, Pb-chalcogenide nanoparticles nucleate and a Pb-chalcogenide nanoparticle solution is formed, which is thereafter cooled to a growth temperature that is below the nucleation temperature. The Pb-chalcogenide nanoparticle solution at the growth temperature is held at the growth temperature for a predetermined time period such that a desired nanoparticle size is obtained. The Pb:chalcogen element ratio and a surfactant in the nucleation and growth solution can control the shape of the Pb-chalcogenide nanoparticles. The nucleation temperature, the growth temperature, the time at which the Pb-chalcogenide nanoparticle solution is held at the growth temperature and a surfactant can control the size of the Pb-chalcogenide nanoparticles.

In one embodiment of the present invention a method for controlling the shape and size of Pb-chalcogenide nanoparticles includes preparing a Pb precursor containing Pb-acetate trihydrate and oleic acid dissolved in trioctyl phosphine (TOP) or diphynel ether (DPE) heated to an elevated temperature of between 100 and 200° C. and maintained at this temperature for a time period of greater than 10 minutes. Thereafter, the Pb precursor is cooled to a temperature lower than the previous maintained temperature. A tellurium (Te) precursor containing tellurium dissolved in TOP is also prepared with a Te content such that a predetermined Pb:Te ratio is present when the Pb precursor is mixed with the Te precursor. The Pb precursor is mixed with the Te precursor to form a Pb—Te mixture precursor such that nucleation of PbTe nanoparticles does not occur. A nucleation and growth solution containing a surfactant in the form of an amine or phosphonic acid dissolved in TOP or DPE is prepared and heated to a nucleation temperature of between 200° C. and the boiling point of the nucleation and growth solution. The Pb—Te mixture is injected into the heated nucleation and growth solution to form a PbTe nanoparticle mixture such that PbTe nanoparticles nucleate therein. After the Pb—Te mixture is injected into the nucleation and growth solution to form the PbTe nanoparticle mixture, the PbTe nanoparticle mixture is cooled to a growth temperature of between 100 and 200° C. The PbTe nanoparticle mixture is held at the growth temperature for a period of between 2 to 10 minutes such that a predetermined nanoparticle size is obtained. The Pb:Te ratio in the Pb—Te mixture and the surfactant determine the shape of the PbTe nanoparticles. The surfactant and the time at the growth temperature determine the size of the PbTe nanoparticles. In this manner, a method for controlling the shape and size of PbTe nanoparticles is provided wherein nanoparticles having a spherical shape, cube shape, cuboctahedral shape or octahedral shape are produced.

DETAILED DESCRIPTION OF THE PREFERRED EMBODIMENTS

Figure 1A:
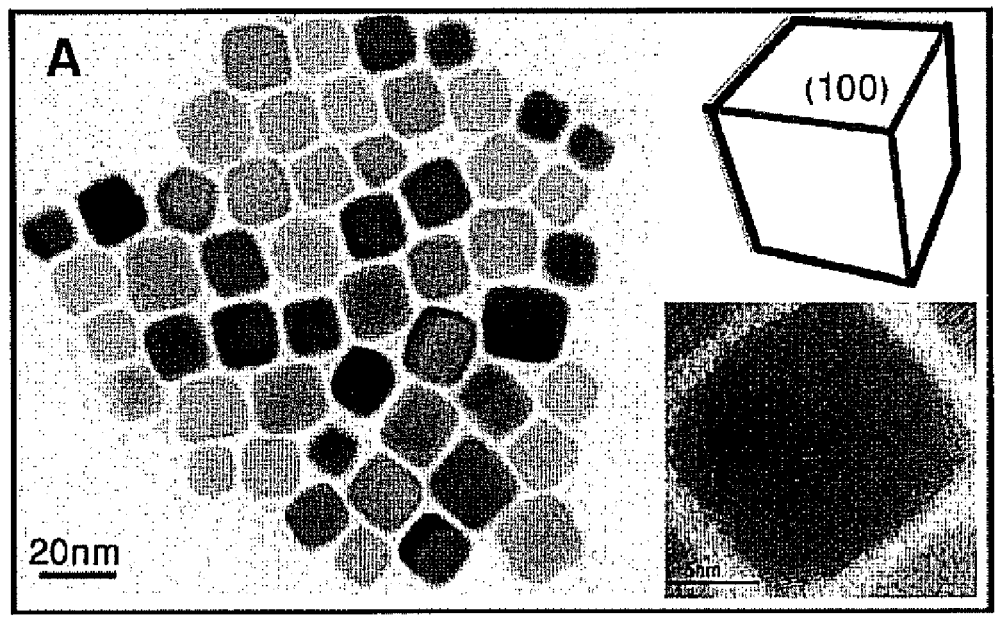
FIG. 1A illustrates a cube-shape morphology of PbTe nanoparticles produced according to an embodiment of the present invention.

The present invention provides a method for producing, and controlling the shape and size of, lead (Pb)-chalcogenide nanoparticles. As such, the present invention has utility as a method for producing semiconductive materials that can be used to improve solar cells, thermoelectric devices, telecommunication equipment, field effect transistors, biological imaging equipment and the like.

The method of the present invention produces, and controls the shape and size of, Pb-chalcogenide nanoparticles. The method controls the shape and size of the nanoparticles by selecting an appropriate surfactant, Pb:chalcogen element ratio, temperature of reaction and time of reaction. In some instances, the Pb:chalcogen ratio can determine the shape of the Pb-chalcogenide nanoparticles. In other instances, the choice of a surfactant in the form of a phosphonic acid or an amine can determine the shape of the Pb-chalcogenide nanoparticles. In yet other instances, the selection of a growth solvent from between diphynel ether (DPE) or trioctyl phosphine (TOP) can control tie shape of the Pb-chalcogenide nanoparticles. Controlling the size of the nanoparticles can be performed by selecting a predetermined growth temperature and/or growth time. The use of a particular phosphonic acid can also be used to control the size of the Pb-chalcogenide nanoparticles wherein a phosphonic acid having a longer hydrocarbon chain can produce nanoparticles of a smaller size when compared to nanoparticles produced using a phosphonic acid with a shorter hydrocarbon chain.

The method of the present invention includes preparing a first precursor that contains Pb, a carboxylic acid and a hydrocarbon solution. In an example, the carboxylic acid is a monounsaturated omega-9 fatty acid and can include oleic acid. In another example, the hydrocarbon solution can be in the form of $(R)_n$—X where R is selected from the group consisting of a $C_2$-$C_{12}$ alkyl or $C_6$-$C_{12}$ aryl, n is equal to 2 or 3 and X is selected from the group consisting of an oxygen atom and a phosphorus atom. In some instances, the hydrocarbon solution can be trioctyl phosphine (TOP) or diphynel ether (DPE). The Pb can be a Pb containing compound in the form of Pb oxide, Pb acetate trihydrate and the like. The Pb containing compound and the carboxylic acid are dissolved into the hydrocarbon solution.

In an embodiment of the present invention, the Pb containing compound and the carboxylic acid are dissolved in the TOP or DPE by adding the components to the TOP or DPE and heating the mixture to an elevated temperature for a predetermined amount of time. In an example, the Pb containing compound and the carboxylic acid is added to the TOP or DPE which is heated to a temperature of between 100 and 200° C. for a time period of greater than 10 minutes under an argon atmosphere. A Pb oleate complex can form which is thereafter dried to remove the water content to a predetermined desired level, for example below 0.5%, or in the alternative below 0.1%. After the Pb precursor has been prepared, it can be cooled to a temperature lower than 100 to 200° C., for example room temperature, 50° C. and the like.

In addition to the Pb precursor, a chalcogen precursor is provided wherein a chalcogen element is dissolved in a hydrocarbon solution. The amount of the chalcogen element dissolved in the hydrocarbon solution is chosen such that a predetermined Pb:chalcogen element ratio is present when the Pb precursor is mixed with the chalcogen precursor. In an example of the present invention, the Pb: chalcogen element ratio is varied from 1:5 to 5:1.

The Pb precursor is mixed with the chalcogen precursor and forms a Pb-chalcogen mixture having a predetermined Pb:chalcogen element ratio. The Pb precursor is mixed with the chalcogen element precursor in such a manner as to prevent nucleation of Pb-chalcogenide nanoparticles.

Either before, during or after the preparation of the Pb-chalcogen mixture, a nucleation and growth solution containing at least one surfactant is prepared. The solution can include an organic compound of the form $(R)_n$—X, wherein R equals a $C_2$-$C_{12}$ alkyl or a $C_6$-$C_{12}$ aryl, n equals 2 or 3, and X can be either oxygen or phosphorus. The surfactant can include a phosphonic acid such as hexylphosphonic acid (HPA), n-tetra-decylphosphonic acid (TDPA) and/or octadecylphosphonic acid (ODPA) or an amine such as hexadecyl amine (HDA) and/or dodecylamine (DDA). The nucleation and growth solution is heated to a nucleation temperature sufficient to nucleate nanoparticles when the Pb-chalcogen mixture is added thereto. In an example of the present invention, the nucleation temperature is between 200° C. and the boiling point of the nucleation and growth solution.

After heating the nucleation and growth solution to the nucleation temperature, a Pb-chalcogen nanoparticle mixture is formed by injecting the Pb-chalcogen mixture into the solution such that Pb-chalcogen nanoparticles nucleate. In some instances, the Pb-chalcogen mixture is injected into the nucleation and growth solution while the solution is vigorously stirred. After the Pb-chalcogen mixture has been injected into the nucleation and growth solution, the Pb-chalcogen nanoparticle mixture is cooled to a growth temperature and maintained at the growth temperature for a predetermined period of time. In some instances, the Pb-chalcogen nanoparticle mixture is cooled to a temperature of between 100 to 200° C. The Pb-chalcogen nanoparticle mixture is held at the growth temperature for a time period of between 2 to 10 minutes, afterwhich the mixture is cooled to room temperature. The Pb-chalcogen nanoparticle mixture can be cooled using a water bath, by natural cooling or some other desired method.

It is appreciated that the present invention affords for the selection of a Pb:chalcogen ratio, surfactant, nucleation temperature, growth temperature and time at the growth temperature in order to produce Pb-chalcogenide nanoparticles with a desired shape and size. In order to better illustrate the present invention, while in no way limiting the scope thereof, examples of the method of making of Pb-chalcogen nanoparticles with a controlled shape and size follow.

EXAMPLE 1

A series of trials were performed wherein the shape of PbTe nanoparticles was controlled through the selection of a Pb:Te molar ratio. The reaction was carried out in a nucleation and growth solution containing TOP or DPE with an HDA amine as a surfactant. The Pb precursor was prepared by dissolving 0.4 grams of Pb acetate trihydrate in 1 millimeter (mL) of oleic acid dissolved in 10 mL of DPE. This precursor was heated to 150° C. for 30 minutes under argon which resulted in the formation of a Pb oleate complex which was thereafter dried to remove any excess water if present. After 30 minutes of heating at 150° C., the Pb precursor was cooled to room temperature and mixed with a Te precursor which was formed by dissolving amorphous Te powder in 4 mL of TOP. The Te precursor was added slowly to the Pb precursor in order to prevent Pb Te nucleation. The amount of Te dissolved into the 4 mL of TOP was varied for different trials in order to produce a Pb—Te mixture with different Pb:Te molar ratios.

The Pb Te solution was injected under vigorous string into a nucleation and growth solution containing 0.3 grams of HDA dissolved in 15 mL of DPE held at 250° C. After the injection of the Pb Te solution into the nucleation and growth solution, the temperature of the solution was cooled to approximately between 170-180° C. and maintained at this temperature for 3-4 minutes. Thereafter, the reaction mixture was cooled to room temperature using a water bath. The cooled solution was mixed with an equal volume of toluene and methanol and the nanoparticles separated from the solution by centrifuge at 6000 rpm for 5 minutes. The nanoparticles were redispersed in chloroform or toluene for further characterization.

One trial was performed using a Pb:Te molar ratio of 1:5. The result of this embodiment resulted in cube-shaped Pb Te nanoparticles with a mean linear dimension of approximately 15 nanometers (nm) as shown in FIG. 1A. For the purposes of the present invention, the term "mean linear dimension" is defined as the mean of the longest dimension of several nanoparticles as determined from viewing the nanoparticles in a high resolution transmission electron microscope. Not being bound by theory, the inventors postulate that the cube-shaped structure is due to the saturation of the particle facets with Te which thereby minimizes the effect of the HDA amine.

Another trial was performed using a Pb:Te ratio of 5:1. This trial resulted in PbTe nanoparticles with an octahedral shape and a mean linear dimension of 15 nm as illustrated in FIG. 1C. Again, not being bound by theory, the inventors postulate that the facets of the nanoparticles are saturated with Pb atoms, leading to faster growth of the {100} facets compared to the {111} since the {111} facets are passivated by the HDA amine.

Figure 1B:
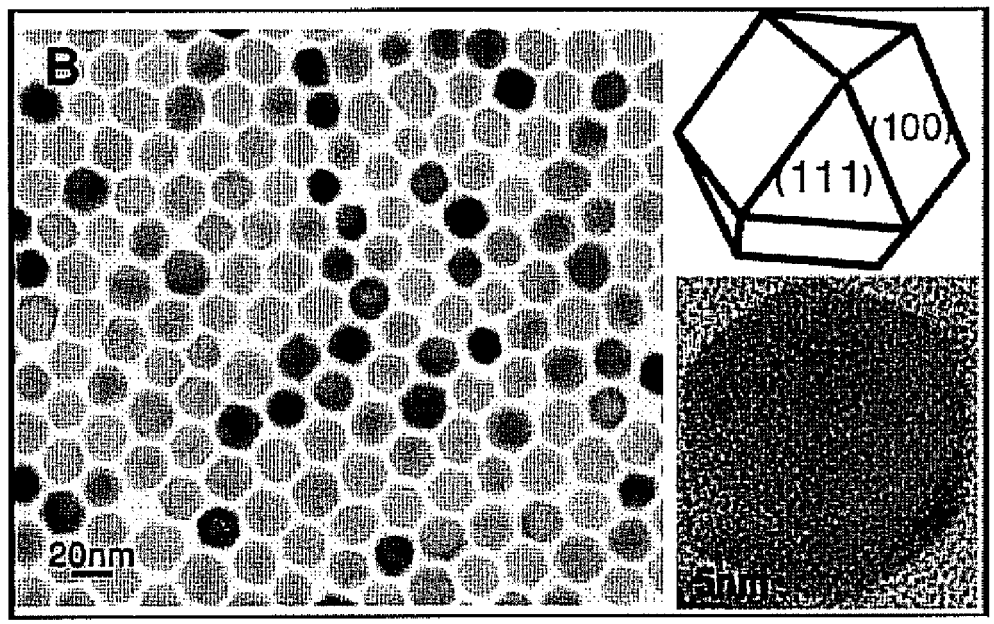
FIG. 1B illustrates a cuboctahedral-shape morphology of PbTe nanoparticles produced according to an embodiment of the present invention.
Figure 1C:
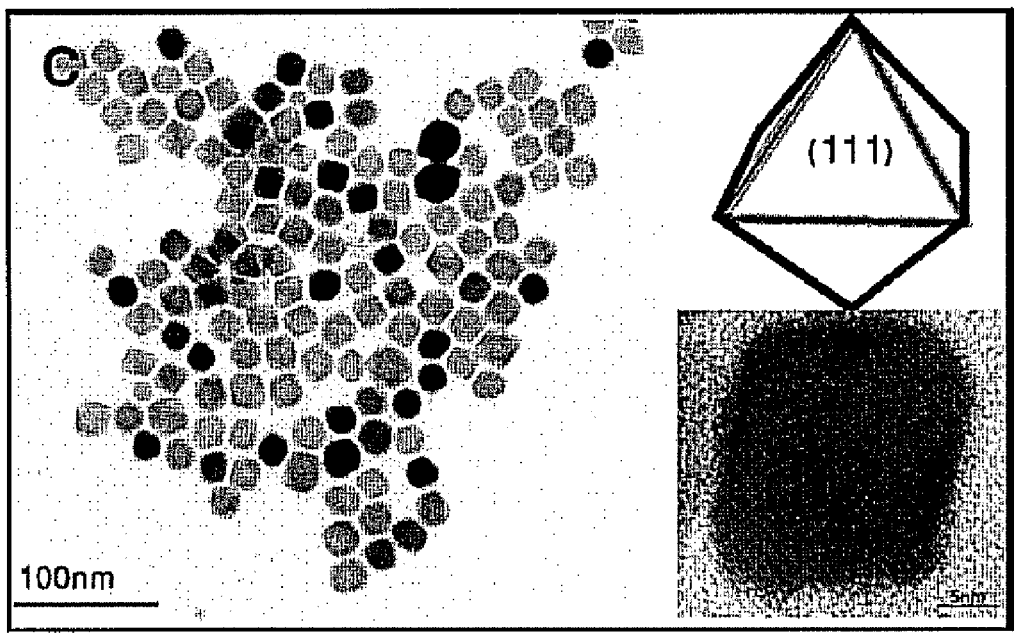
FIG. 1C illustrates an octahedral-shape morphology of PbTe nanoparticles produced according to an embodiment of the present invention.

Yet another production run was performed using a Pb:Te molar ratio of 1:1 wherein cuboctahedral-shape PbTe nanoparticles were produced with a mean linear dimension of approximately 13 nm as illustrated in FIG. 1B. In this intermediate range of Pb to Te molar ratio, the {100} facets and the {111} facets exhibit growth such as to form the cuboctahedral shape. In this manner, the molar ratio of Pb to Te is used to control the shape of Pb Te nanoparticles. It is appreciated that other Pb-chalcogen elements molar ratios can be varied in order to control the size of a respective Pb-chalcogen nanoparticle.

EXAMPLE 2

Trials were performed using an approximate Pb:Te molar ratio of 1:1 while varying the surfactant within the nucleation and growth solution. The Pb precursor was prepared by dissolving 0.38 grams of Pb acetate trihydrate and 1 mL of oleic acid in 5 mL of TOP. The Pb precursor solution was heated to 150° C. for at least 45 minutes under argon wherein a Pb oleate complex was formed and subsequently dried in order to remove excess water. After the Pb precursor was heated at 150° C. for 45 minutes, the solution was cooled to 50° C. and mixed with a Te precursor made from 0.4 grams of Te dissolved in 2 mL of TOP. The Te solution was added slowly to the Pb precursor in order to prevent nucleation of Pb Te nanoparticles.

A nucleation and growth solution was prepared by dissolving 0.1 grams of DTPA in 5 mL of TOP and heating the solution to 250° C. The Pb—Te mixture was injected into the hot (250° C.) nucleation and growth solution under vigorous stirring. After the Pb—Te mixture was injected into the nucleation and growth solution, the temperature of the final mixture was cooled to 150-160° C. and maintained at this temperature for 2-8 minutes, depending on the desired nanoparticle size. The separation of the nanoparticles from the solution was performed as described in Example 1 above.

Figures 2A, 2B:
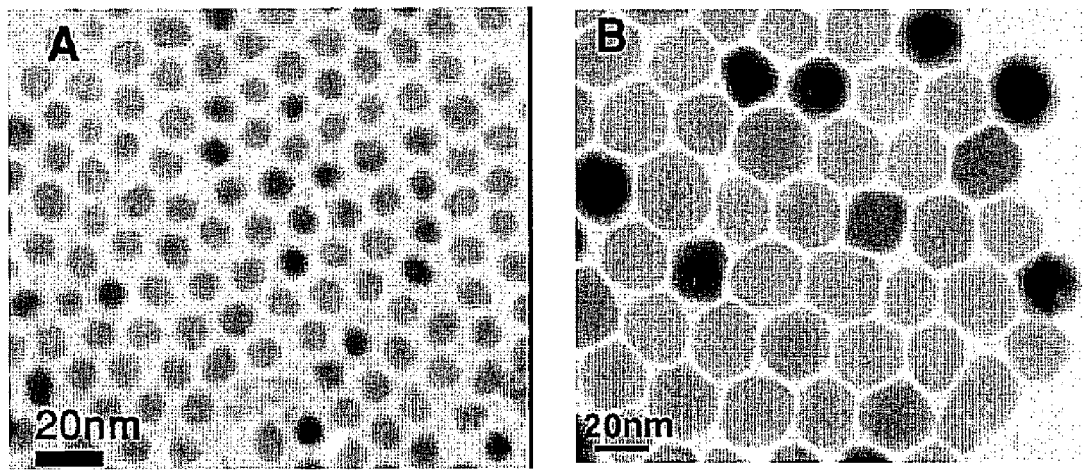
FIGS. 2A-2B illustrate PbTe nanoparticles of different size produced according to the present invention.

Identical trials were performed using the same parameters except for the substitution of TDPA with HPA. As shown in FIGS. 2A and 2B, PbTe nanoparticles with a mean linear dimension of approximately 8 nanometers were produced using TDPA as the surfactant, whereas PbTe nanoparticles with a mean linear dimension of approximately 22 nanometers were produced using HPA as the surfactant. Not being bound by theory, the inventors postulate that the smaller size nanoparticles for the TDPA surfactant containing nucleation and growth solution is a result of the longer hydrocarbon chain of this phosphonic acid compared to the HPA ligand. In an effort to further establish this postulate, a trial using ODPA was performed wherein even smaller nanoparticles with a mean linear dimension of 3-5 nanometers was produced. These trials therefore illustrate that the longer the hydrocarbon chain or a surfactant the smaller the Pb-chalcogen nanoparticle formed. This effect is postulated to be due to a slower nucleation and growth rate when larger hydrocarbon molecules are present in the solution.

EXAMPLE 3

Figures 3A, 3B:
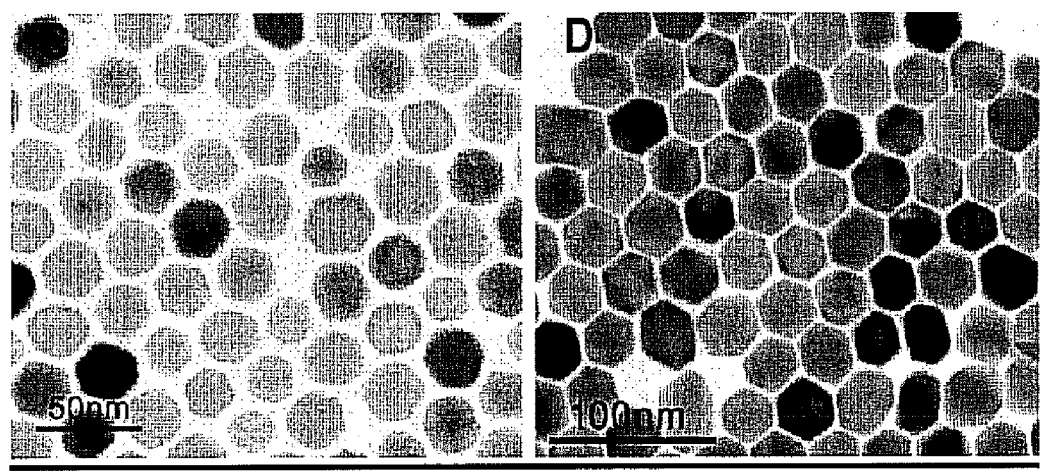
FIGS. 3A-3B illustrate PbTe nanoparticles of different size produced according to the present invention.

The use of time to control the size of Pb Te nanoparticles was also demonstrated as shown in FIGS. 3A and 3B. FIG. 3A illustrates Pb Te cuboctahedral particles with a mean linear dimension of approximately 28 nanometers obtained by holding the nucleation and growth solution at a temperature between 150-160° C. for 5 minutes after the injection of the Pb Te mixture. In contrast, FIG. 3B illustrates cuboctahedral Pb Te nanoparticles with a mean linear dimension of approximately 40 nanometers obtained after 7 minutes of growth at the growth temperature of between 150-160° C. In this manner, time is used to control the size of Pb-chalcogenide nanoparticles.

It is postulated that slow growth kinetics of both the {111} and {100} facets Pbs to a cube-shaped nanoparticle. Therefore, the use of a phosphonic acid group which has strong binding to the nanoparticle surfaces can produce slow growth kinetics and thus cube-shaped particles. In addition, changing the growth solvent from DPE to TOP can result in a cuboctahedral shaped nanoparticle as opposed to the cube shape.

Figure 4:
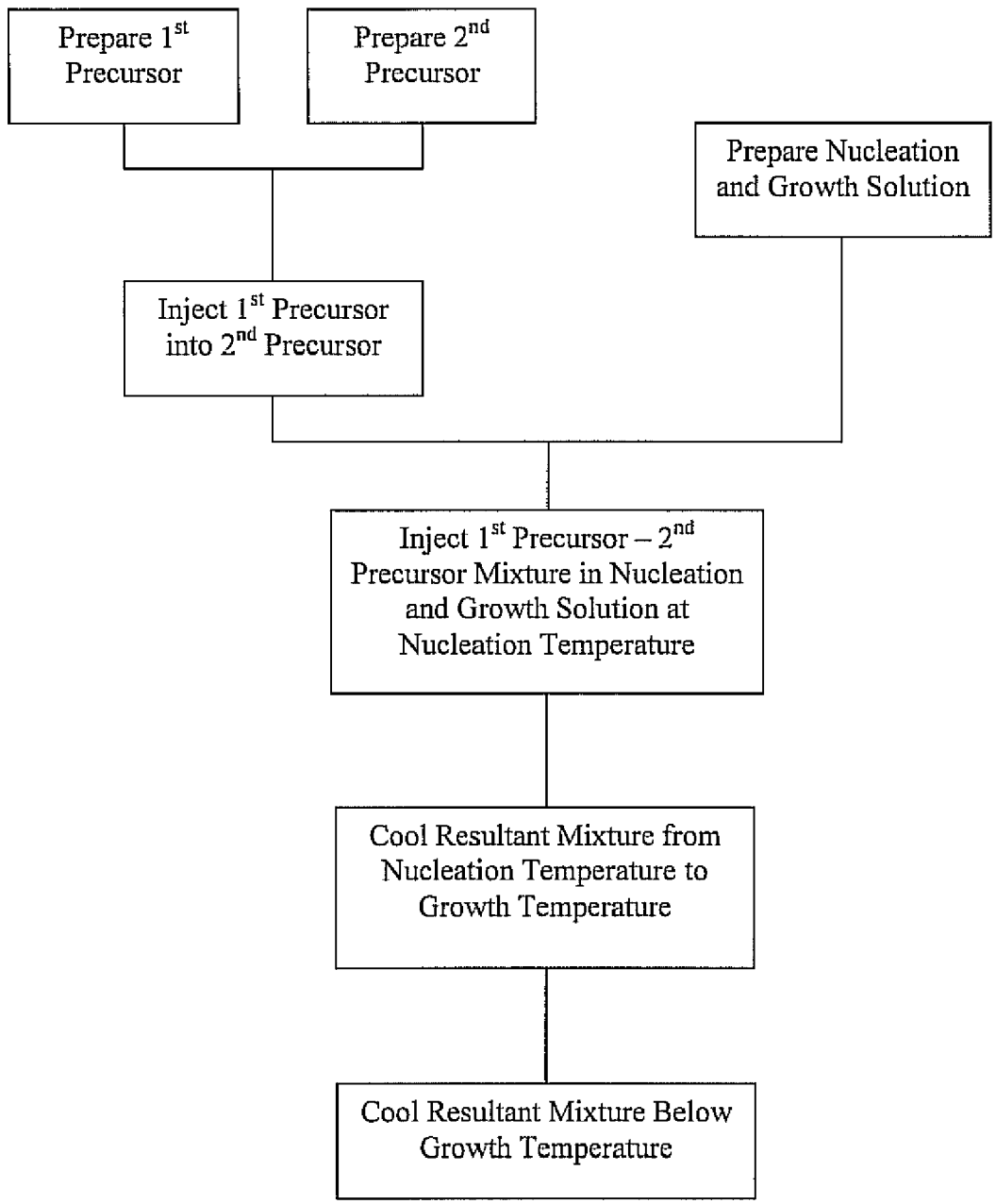
FIG. 4 is a flow chart of an embodiment of the present invention.

A flowchart of the an embodiment is shown in FIG. 4 wherein a first precursor is prepared, a second precursor is prepared, the second precursor is injected into the first precursor which is then injected into a nucleation and growth solution wherein Pb chalcogenide nanoparticles are nucleated and grown. In some instances, the first precursor is Pb oxide or Pb acetate trihydrate mixed with oleic acid both of which are dissolved in TOP. The TOP serves as a ligand that stabilizes the Pb and dictates the reactivity thereof. The second precursor can be amorphous Te powder which is dissolved in TOP forming TOPTe wherein the TOP serves as a ligand to stabilize the Te atom and dictate the reactivity thereof. The injection of the second precursor into the first precursor is performed in such a manner that nucleation of the Pb and the chalcogen does not occur. The nucleation of the Pb and chalcogen is delayed until the mixture of the first precursor and the second precursor are injected into the nucleation and growth solution which has been heated and held at a nucleation temperature. After the injection of the first precursor and second precursor mixture into the nucleation and growth solution, this final solution is cooled to a growth temperature where continued growth of the nanoparticles occurs. After a desired and predetermined amount of time at the growth temperature, the solution is cooled further in order to stop any further growth of the nanoparticles. The nucleation and growth solution can include a phosphonic acid such as HPA, TDPA and/or ODPA. These linear alkyl phosphonic acids have a classic bifunctional chemical structure, RP(O)(OH)$_2$, consisting of both non-polar organic hydrophobic groups and anionic inorganic hydrophilic groups.

The control of the nanoparticle size and shape is desirable in that the infrared absorption of the nanoparticles is a function of their size and the thermal conductivity of a Pb chalcogen device decreases as the particle size decreases due to an increase in boundaries and therefore an increase in phonon scattering. The different surfactants used in the present invention have a tendency to attach to different crystallographic planes or facets and thereby afford for die control of the shape of the particles by enhancing or deterring growth of the nanoparticles in certain directions.

The Pb Te nanoparticles produced according to the present invention exhibited single crystalline structure as studied by high resolution transmission electron microscopy. In addition, the particles exhibited crystalline microstructures as shown by powder x-ray diffraction measurements which agreed perfectly with bulk Pb Te material. Selected area energy dispersive x-ray spectroscopy of single Pb Te nanoparticles also showed the same chemical composition as Pb Te bulk samples. In this manner, the present invention affords for the control of the shape and size of Pb chalcogenides nanoparticles wherein the shape is a function of the Pb to chalcogen molar ratio and/or surfactant used in the nucleation and growth solution and the size of the nanoparticles is a function of the nucleation temperature, growth temperature, the time at the growth temperature and/or surfactant.

The foregoing drawings, discussion and description are illustrative of specific embodiments of the present invention, but they are not meant to be limitations upon the practice thereof. Numerous modifications and variations of the invention will be readily apparent to those of skill in the art in view of the teaching presented herein. It is the following claims, including all equivalents, which define the scope of the invention.

The invention claimed is:

1. A method for producing lead (Pb)-chalcogenide nanoparticles, the method being operable to control the shape and size of the Pb-chalcogenide nanoparticles, and comprising of the steps:
    preparing a Pb precursor containing a Pb compound and a carboxylic acid dissolved in a hydrocarbon solution of the form $(R)_n$—X where R is selected from the group consisting of a $C_2$-$C_{12}$ alkyl and $C_6$-$C_{12}$ aryl, n is equal to 2 or 3 and X is selected from the group consisting of an oxygen atom and a phosphorus atom;
    preparing a chalcogen element precursor containing a chalcogen element dissolved in a hydrocarbon solution of the form $(R)_n$—X where R is selected from the group consisting of a $C_2$-$C_{12}$ alkyl and $C_6$-$C_{12}$ aryl, n is equal to 2 or 3 and X is selected from the group consisting of an oxygen atom and a phosphorus atom, wherein the amount of the chalcogen element dissolved in the hydrocarbon being such that a Pb:chalcogen element ratio is present when the Pb precursor is mixed with the chalcogen precursor; and
    mixing the Pb precursor with the chalcogen element precursor to make a Pb-chalcogen mixture having the Pb:chalcogen element ratio;
    preparing a nucleation and growth solution containing a surfactant;
    heating the nucleation and growth solution to a nucleation temperature sufficient to nucleate Pb-chalcogenide nanoparticles when the Pb-chalcogen mixture is added;
    injecting the Pb-chalcogen element mixture into the nucleation and growth solution whereby said nucleation and growth solution causes Pb-chalcogenide nanoparticles to nucleate;
    cooling the Pb-chalcogenide nanoparticle solution to a growth temperature that is below the nucleation temperature;
    holding the Pb-chalcogenide nanoparticle solution at the growth temperature for a predetermined time period such that a desired nanoparticle size is obtained; and
    cooling the Pb-chalcogenide nanoparticle solution to a temperature below the growth temperature such that continued growth of the Pb-chalcogenide nanoparticles is terminated.

2. The method of claim 1, wherein the Pb compound is a carboxylate of Pb.

3. The method of claim 1, wherein the Pb compound is Pb acetate trihydrate.

4. The method of claim 1, wherein the carboxylic acid is a monounsaturated omega-9 fatty acid.

5. The method of claim 4, wherein the monounsaturated omega-9 fatty acid is oleic acid.

6. The method of claim 1, wherein preparing the Pb precursor further includes heating the Pb precursor to an elevated temperature of between 100 to 200° C.

7. The method of claim 6, wherein the heated Pb precursor is held at the elevated temperature for a time period of greater than 5 minutes.

8. The method of claim 1, wherein the hydrocarbon solution of the form $(R)n$—X is selected from the group consisting of trioctyl phosphine and diphenyl ether.

9. The method of claim 1, wherein the chalcogen element is selected from the group consisting of sulfur, tellurium and selenium.

10. The method of claim 9, wherein the Pb:chalcogen element ratio is between 1:5 and 5:1.

11. The method of claim 1, wherein the nucleation and growth solution contains the surfactant in the form of a phosphonic acid.

12. The method of claim 11, wherein the phosphonic acid is selected from the group consisting of hexylphosphonic acid, tetradecyl phosphonic acid and octadecyl phosphonic acid.

13. The method of claim 1, wherein the nucleation and growth solution contains the surfactant in the form of an amine.

14. The method of claim 13, wherein the amine is selected from the group consisting of hexadecyl amine and dodecylamine.

15. The method of claim 1, wherein the nucleation temperature is between 200° C. and the boiling point of the nucleation and growth solution.

16. The method of claim 1, wherein the growth temperature is between 100 and 200° C.

17. The method of claim 1, wherein the predetermined time period for holding the Pb-chalcogenide nanoparticle solution at the growth temperature is between 2 and 10 minutes.

18. The method of claim 1, wherein the shape of the Pb-chalcogenide nanoparticles is selected from the group consisting of a sphere, a cube, an octahedral and a cuboctahedral.

19. A method for producing Pb-chalcogenide nanoparticles, the method being operable to control the shape and size of the Pb-chalcogenide nanoparticles, and comprising of the steps:
    preparing a Pb precursor by adding Pb-acetate trihydrate and oleic acid to diphenyl ether, the diphenyl ether heated to an elevated temperature between 100 and 200° C.;
    holding the diphenyl ether at the elevated temperature for a time period greater than 10 minutes after the Pb-acetate trihydrate and oleic acid have been added such that the Pb-acetate trihydrate and oleic acid are dissolved into the diphenyl ether;
    cooling the Pb precursor to a temperature lower than 150° C.;
    preparing a tellurium (Te) precursor containing Te dissolved in trioctyl phosphine, the amount of Te being such that a predetermined Pb:Te ratio will be present when the Pb precursor is mixed with the Te precursor;
    mixing the Pb precursor with the Te precursor to form a PbTe precursor such that the Pb and the Te remain in their precursor form;

preparing a nucleation and growth solution by dissolving a surfactant in the form of an amine in diphenyl ether;

heating the nucleation and growth solution to a nucleation temperature between 200° C. and the boiling point of the solution;

injecting the PbTe precursor into the nucleation and growth solution heated to the nucleation temperature to form a PbTe nanoparticle solution such that PbTe nanoparticles nucleate;

cooling the PbTe nanoparticle solution to a growth temperature between 100 to 200° C.;

holding the PbTe nanoparticle solution at the growth temperature for a time period between 2 to 10 minutes such that a predetermined nanoparticle size is obtained; and cooling the PbTe nanoparticle solution to a lower temperature such that continued growth of the Pb:Te nanoparticles is terminated.

20. A method for producing Pb-chalcogenide nanoparticles, the method operable to control the shape and size of the Pb-chalcogenide nanoparticles, and comprising of the steps:

preparing a Pb precursor by adding Pb-acetate trihydrate and oleic acid to trioctyl phosphine, the trioctyl phosphine heated to an elevated temperature between 100 and 200° C.;

holding the trioctyl phosphine at the elevated temperature for a time period greater than 10 minutes after the Pb-acetate trihydrate and oleic acid have been added such that the Pb-acetate trihydrate and oleic acid are dissolved into the trioctyl phosphine;

cooling the Pb precursor to a temperature lower than 150° C.;

preparing a tellurium (Te) precursor containing Te dissolved in trioctyl phosphine, the amount of Te being such that a predetermined Pb:Te ratio will be present when the Pb precursor is mixed with the Te precursor;

mixing the Pb precursor with the Te precursor to form a PbTe precursor such that the Pb and the Te remain in their precursor form;

preparing a nucleation and growth solution by dissolving a surfactant in the form of a phosphonic acid in trioctyl phosphine;

heating the nucleation and growth solution to a nucleation temperature between 200° C. and the boiling point of the solution;

injecting the PbTe precursor into the nucleation and growth solution heated to the nucleation temperature to form a PbTe nanoparticle solution such that PbTe nanoparticles nucleate;

cooling the PbTe nanoparticle solution to a growth temperature between 100 to 200° C.;

holding the PbTe nanoparticle solution at the growth temperature for a time period between 2 to 10 minutes such that a predetermined nanoparticle size is obtained; and cooling the PbTe nanoparticle solution to a lower temperature such that continued growth of the Pb:Te nanoparticles is terminated.

* * * * *